(12) United States Patent
Watanabe

(10) Patent No.: US 8,647,816 B2
(45) Date of Patent: Feb. 11, 2014

(54) METHOD OF MANUFACTURING ELECTRONIC DEVICE

(75) Inventor: Kyouhei Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 225 days.

(21) Appl. No.: 13/104,269

(22) Filed: May 10, 2011

(65) Prior Publication Data

US 2011/0287368 A1 Nov. 24, 2011

(30) Foreign Application Priority Data

May 18, 2010 (JP) ................................. 2010-114708

(51) Int. Cl.
*G03F 7/26* (2006.01)
(52) U.S. Cl.
USPC .......................................... 430/313; 430/311
(58) Field of Classification Search
USPC .................... 430/311, 322, 323, 320
See application file for complete search history.

(56) References Cited

U.S. PATENT DOCUMENTS

| | | | | |
|---|---|---|---|---|
| 5,689,372 | A | * | 11/1997 | Morton .......................... 359/623 |
| 5,948,281 | A | | 9/1999 | Okazaki et al. |
| 7,713,777 | B2 | | 5/2010 | Ryu |

FOREIGN PATENT DOCUMENTS

| | | |
|---|---|---|
| JP | 4-268763 | 9/1992 |
| JP | 10-148704 | 6/1998 |
| JP | 2007-193266 | 8/2007 |

OTHER PUBLICATIONS

Office Action dated Feb. 4, 2013, issued by the Chinese Patent Office in Chinese patent application 20110128547.6.

* cited by examiner

*Primary Examiner* — Kathleen Duda
(74) *Attorney, Agent, or Firm* — Fitzpatrick, Cella, Harper & Scinto

(57) ABSTRACT

A method of manufacturing an electronic device, comprises forming a material layer, forming an anti-halation layer on the material layer, forming a resist layer on the anti-halation layer, forming a resist pattern including a plurality of island patterns by patterning the resist layer through an exposure step and a development step, forming a mask layer having a plurality of moderate convex shape portions by annealing the resist pattern to change shapes of the island patterns to moderate convex shapes, and plasma-processing the mask layer, the anti-halation layer, and the material layer so as to remove the mask layer and the anti-halation layer and change the material layer to a microlens array including a plurality of microlenses, wherein the anti-halation layer reduces halation in the exposure step.

18 Claims, 2 Drawing Sheets

FIG. 2A
FIG. 2B
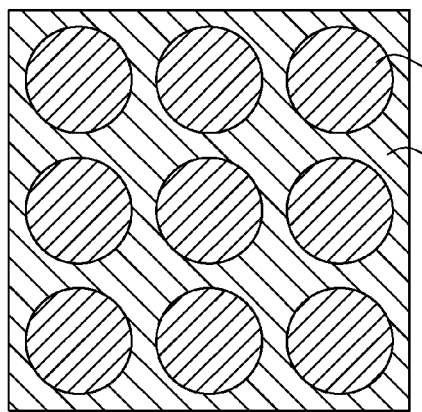
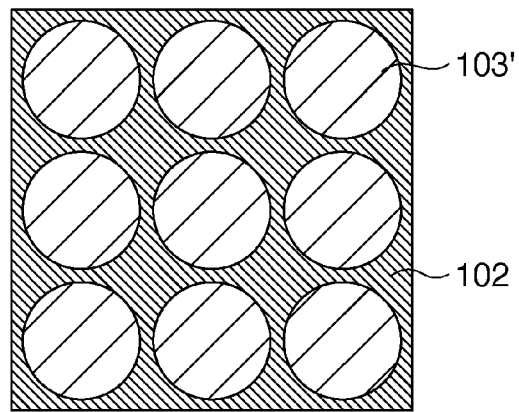
FIG. 3
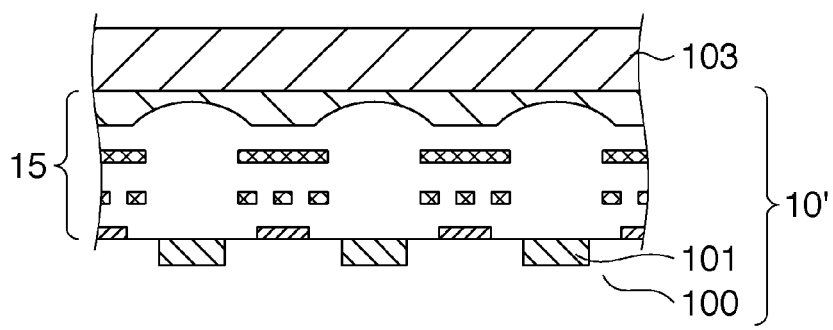

METHOD OF MANUFACTURING ELECTRONIC DEVICE

BACKGROUND OF THE INVENTION

1. Field of the Invention

The present invention relates to a method of manufacturing an electronic device and, more particularly, to a method of manufacturing an electronic device having microlenses.

2. Description of the Related Art

An electronic device such as a solid-state image sensor or a liquid crystal display device can include microlenses for light collection. In a microlens forming method disclosed in Japanese Patent Laid-Open No. 10-148704, a mask layer having the three-dimensional shape of a microlens array is formed on a material layer, and the mask layer and the material layer are etched to form the microlens array in the material layer.

When forming microlenses by the method described in Japanese Patent Laid-Open No. 10-148704, the shape of the microlenses is determined by the three-dimensional shape of the mask layer. For this reason, when the three-dimensional shape varies, the microlens shape varies. The three-dimensional shape of the mask layer can vary in the exposure step of forming the mask layer due to halation of light that enters a resist layer to be used to form the mask layer and is reflected by a layer (for example, a color filter layer, a wiring layer, or an underlying substrate) under the resist layer. The variation in the microlens shape undesirably influences the electro-optical characteristics (for example, color unevenness, sensitivity, and f-number proportion) of a solid-state image sensor. Especially in a 3-chip solid-state image sensor such as 3-CCD or 3-CMOS type solid-state image sensor, the three-dimensional shape of the mask layer readily varies when forming it by photolithography. This is because the 3-chip solid-state image sensor includes no color filter, and the light that has passed through the mask layer in the exposure step is not absorbed by the color filter. Hence, a technique of stabilizing the microlens shape is particularly important for the 3-chip solid-state image sensor. The 3-chip solid-state image sensor is a device which includes three chips each having a plurality of photoelectric conversion units to sense light separated by an optical element, such as a prism, and which obtains one image based on the lights sensed by the three chips.

In addition, as the pixel size of the solid-state image sensor becomes smaller, the variation in the microlens shape more largely affects the optical characteristics. This is because the variation in the light collection efficiency caused by the variation in the microlens shape readily affects the optical characteristics when the area of the light receiving unit is reduced along with the pixel size reduction of the solid-state image sensor. Hence, the technique of stabilizing the microlens shape is also important for pixel size reduction of the solid-state image sensor. In a liquid crystal display device as well, as the pixel size becomes smaller, the variation in the microlens shape largely affects the optical characteristics.

SUMMARY OF THE INVENTION

The present invention provides a manufacturing method advantageous in reducing the variation in the microlens shape.

One of the aspects of the present invention provides a method of manufacturing an electronic device, comprising forming a material layer, forming an anti-halation layer on the material layer, forming a resist layer on the anti-halation layer, forming a resist pattern including a plurality of island patterns by patterning the resist layer through an exposure step and a development step, forming a mask layer having a plurality of moderate convex shape portions by annealing the resist pattern to change shapes of the island patterns to moderate convex shapes, and plasma-processing the mask layer, the anti-halation layer, and the material layer so as to remove the mask layer and the anti-halation layer and change the material layer to a microlens array including a plurality of microlenses, wherein the anti-halation layer reduces halation in the exposure step.

Further features of the present invention will become apparent from the following description of exemplary embodiments with reference to the attached drawings.

BRIEF DESCRIPTION OF THE DRAWINGS

FIGS. 2A and 2B are plan views for explaining a method of manufacturing microlenses or a solid-state image sensor according to the second embodiment of the present invention; and FIG. 3 is a sectional view showing the relationship between the area of a microlens and the area of a convex shape portion of a mask layer.

DESCRIPTION OF THE EMBODIMENTS

Figure 1A:
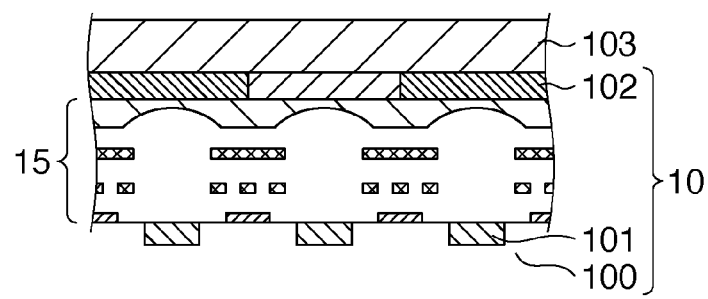
FIGS. 1A to 1E are sectional views for explaining a method of manufacturing microlenses or a solid-state image sensor according to the first embodiment of the present invention.

The first embodiment of the present invention is directed to a single-chip solid-state image sensor. The single-chip image sensor has color filters having a plurality of colors arranged on one chip that includes a plurality of photoelectric conversion units, and the single-chip image sensor obtains one image by sensing a plurality of color information by the chip. A method of manufacturing microlenses or the solid-state image sensor according to the first embodiment of the present invention will be described with reference to FIGS. 1A to 1E. First, in the step shown in FIG. 1A, a material layer 103 made of the material of microlenses is formed on a stacked structure 10. The stacked structure 10 can include a semiconductor substrate 100 with photoelectric conversion units (for example, photodiodes) 101, a wiring structure 15 arranged on the semiconductor substrate 100, and a color filter layer 102 arranged on the wiring structure 15. The wiring structure 15 can include, for example, a gate pattern layer including the gate patterns of MOS transistors, a wiring layer including an electrically conductive pattern, and an interlayer insulating film. In this embodiment, the stacked structure also includes an inner-layer lens layer and a planarization layer. The material layer 103 can be made of, for example, an acrylic-based resin, a polystyrene-based resin, or a polyimide-based resin.

Figure 1B:
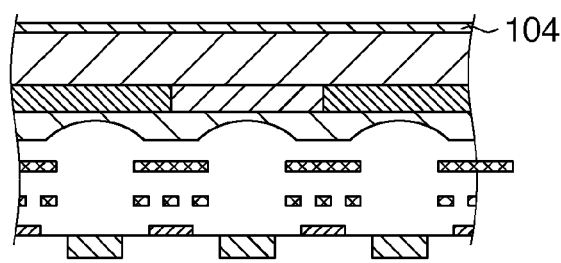

Next, in the step shown in FIG. 1B, an anti-halation layer 104 is formed on the material layer 103. The anti-halation layer 104 is formed to reduce halation in the exposure step of forming a resist pattern 105 (or a mask layer 105'). For example, the anti-halation layer 104 can be made of a material that absorbs exposure light used in the exposure step more than the material layer 103 does. That is, the spectral transmittance of the anti-halation layer 104 to the exposure light is lower than that of the material layer 103. For example, when i-line (wavelength=365 nm) is used in the exposure step, halation can effectively be reduced by forming the anti-halation layer 104 using an acrylic-based resin whose spectral transmittance in 365 nm is 60% or less. Reducing halation enables reduction of variation in the three-dimensional shape of the resist pattern 105 (or the mask layer 105').

Figure 1C:
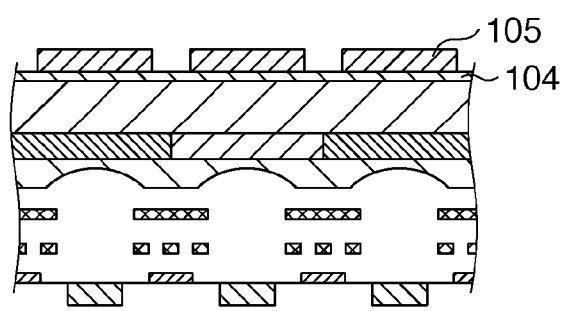

In the step shown in FIG. 1C, the resist pattern 105 including island patterns corresponding to the microlenses of the microlens array to be formed is formed on the anti-halation layer 104 using a resist material. More specifically, this step includes a step of forming a resist layer on the anti-halation layer 104, and a step of patterning the resist layer. The step of patterning the resist layer includes the exposure step of forming a latent image pattern on the resist layer using an exposure apparatus, and a development step of developing the resist layer. The resist layer can be made of, for example, an acrylic-, polystyrene-, or polyimide-based photosensitive resin.

Figure 1D:
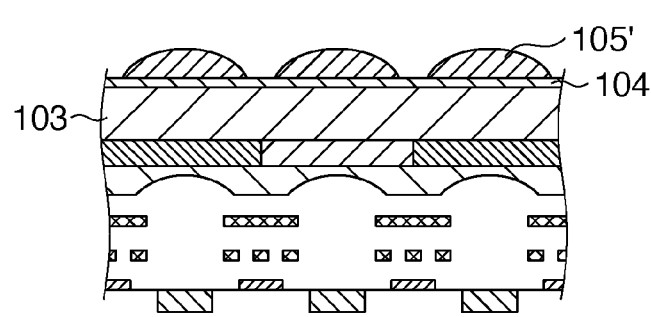

In the step shown in FIG. 1D, the island patterns of the resist pattern 105 are melted by annealing (heating) so that they change to moderate convex shape portions due to the surface tension. The mask layer 105' having the convex shape portions corresponding to the microlenses of the microlens array to be formed is thus formed.

Figure 1E:
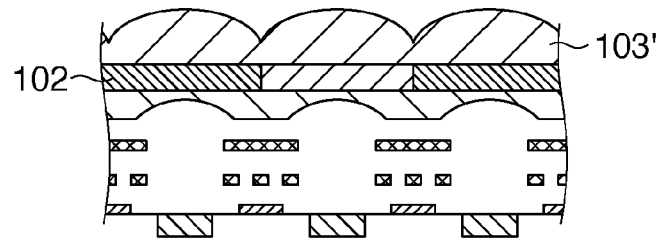

In the step shown in FIG. 1E, the mask layer 105', the anti-halation layer 104, and the material layer 103 are plasma-processed to transfer the convex shape portions of the mask layer 105' to the material layer 103. The mask layer 105' and the anti-halation layer 104 are removed. The material layer 103 changes to a microlens array 103' having a plurality of microlenses arranged in an array. This plasma process can be performed under, for example, such process conditions that make the area of the convex shape portion of each microlens of the microlens array 103' larger than the area of each convex shape portion of the mask layer 105'. This area refers to the projected area of the bottom surface of the convex shape portion of the mask layer 105' or a microlens on a plane parallel to the light receiving surfaces of the photoelectric conversion units. This is effective for reducing the gap between the microlenses and improving the light collection efficiency. The plasma process time is determined to remove the mask layer 105' and the anti-halation layer 104 by etching.

The plasma process can be done by a magnetron RIE system using a mixed gas of, for example, $CF_4$ and $C_4F_8$ as a process gas. For example, the total flow rate of the mixed gas of $CF_4$ and $C_4F_8$ can range from 100 to 200 sccm. The radio frequency power of the magnetron RIE system can range from 3 to 5 $W/cm^2$. The pressure in the chamber of the magnetron RIE system can range from 20 to 50 mTorr. When the plasma process is executed under these process conditions, etching by fluorine and the like and deposition of a fluorine containing material (CF-based product) progress. The etching rate of the material layer 103 is higher near the apex of each microlens than near the tail. Hence, as shown in FIGS. 2A and 2B, the base area of the microlenses of the microlens array 103' can be larger than the base area of the convex shape portion of the mask layer 105'. FIG. 2A is a plan view showing the layout viewed from the upper side in a state in which the mask layer 105' is formed. FIG. 2B is a plan view showing the layout viewed from the upper side in a state in which the microlens array 103' is formed.

When the plasma process is executed under these process conditions, the deposition of the fluorine containing material on the entire surfaces of the microlenses finally becomes more dominant than the etching. A fluorine containing material layer having a thickness of about 30 to 100 nm is formed on the surface of each microlens. If the refractive index of the material layer 103 is higher than that of the fluorine containing material, the fluorine containing material layer serves as an anti-reflection film. This allows a reduction in interface reflection of incident light on the surfaces of the microlenses of the microlens array 103'. It is therefore possible to not only form microlenses with less shape variation but also improve the light collection efficiency on the light receiving unit of the solid-state image sensor.

The second embodiment of the present invention is directed to a 3-CCD or 3-CMOS type solid-state image sensor. A method of manufacturing the solid-state image sensor according to the second embodiment of the present invention will be described with reference to FIG. 3. In the step shown in FIG. 3, a material layer 103 made of the material of microlenses is formed on a stacked structure 10'. The stacked structure 10' can include a semiconductor substrate 100 with photoelectric conversion units (for example, photodiodes) 101 and a wiring structure 15 arranged on the semiconductor substrate 100 but no color filter layer. In this embodiment, the stacked structure 10' also includes an inner-layer lens layer and a planarization layer. The wiring structure 15 can include, for example, a gate pattern layer including the gate patterns of MOS transistors, a wiring layer including an electrically conductive pattern, and an interlayer insulating film. The material layer 103 can be made of, for example, an acrylic-based resin, a polystyrene-based resin, or a polyimide-based resin. After the step shown in FIG. 3, the steps shown in FIGS. 1B to 1E are performed. However, no color filter layer is provided in the second embodiment.

In the first and second embodiments, the process conditions of the plasma process shown in FIG. 1E are merely examples. Various other conditions can also be adopted. In this case, process conditions that make the area of each microlens of the microlens array 103' larger than that of each convex shape portion of the mask layer 105' are preferably adopted. However, the present invention is not limited to this.

[Application Example]

The first and second embodiments are directed to a solid-state image sensor such as a CCD or CMOS sensor. However, the present invention is applicable not only to the solid-state image sensor but also to a display device such as a liquid crystal display device having microlenses. The display device can include, for example, a light source, a panel having a plurality of pixels, and a microlens array having a plurality of microlenses which collect light emitted by the light source onto the plurality of pixels, respectively. That is, the present invention is applicable to any electronic device having microlenses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-114708, filed May 18, 2010, which is hereby incorporated by reference herein in its entirety.

What is claimed is:

1. A method of manufacturing an electronic device, comprising:
   forming a material layer;
   forming an anti-halation layer on the material layer, the anti-halation layer being made of a resin;
   forming a resist layer on the anti-halation layer, the resist layer being made of a photosensitive resin;
   forming a plurality of convex shape portions from the resist layer through exposure and development of the resist layer; and
   etching the material layer while etching the plurality of convex shape portions and the anti-halation layer so that a plurality of microlenses corresponding to the plurality of convex shape portions is formed from the material layer, wherein the anti-halation layer reduces halation in the exposure.

2. The method according to claim 1, wherein the etching is performed by a plasma process using a process gas containing $CF_4$ and $C_4F_8$.

3. The method according to claim 2, wherein a magnetron RIE system is used in the plasma process.

4. The method according to claim 3, wherein the plasma process is performed by setting a flow rate of the process gas in a range of 100 to 200 sccm, a radio frequency power of the magnetron RIE system in a range of 3 to 5 $W/cm^2$, and a pressure in a chamber of the magnetron RIE system in a range of 20 to 50 mmTorr.

5. The method according to claim 1, wherein the anti-halation layer has a transmittance of not more than 60% for exposure light used in the exposure.

6. The method according to claim 1, wherein the etching is performed under such a condition that makes a base area of the microlens larger than a base area of the convex shape portion.

7. The method according to claim 1, wherein the electronic device includes a solid-state image sensor including a photoelectric conversion unit.

8. The method according to claim 1, wherein forming the plurality of convex shape portions includes annealing island patterns formed from the resin layer by the exposure and the development.

9. The method according to claim 1, wherein the plurality of convex shape portions and the anti-halation layer are removed through the etching.

10. The method according to claim 1, wherein the etching is executed under a condition where a fluorine containing material layer is formed on the surface of each of the plurality of microlenses.

11. The method according to claim 1, wherein the material layer is made of a resin.

12. A method of manufacturing an electronic device, comprising:
forming a material layer;
forming an anti-halation layer on the material layer, the anti-halation layer being made of a resin;
forming a resist layer on the anti-halation layer, the resist layer being made of a photosensitive resin;
forming a plurality of convex shape portions from the resist layer through an exposure and a development of the resist layer; and
etching the material layer while etching the plurality of convex shape portions and the anti-halation layer so that a plurality of microlenses corresponding to the plurality of convex shape portions is formed from the material layer,
wherein the anti-halation layer has a spectral transmittance lower than that of the material layer for exposure light in the exposure.

13. The method according to claim 12, wherein forming the plurality of convex shape portions includes annealing island patterns formed from the resin layer by the exposure and the development.

14. The method according to claim 12, wherein the plurality of convex shape portions and the anti-halation layer are removed through the etching.

15. The method according to claim 12, wherein the etching is executed under a condition where a fluorine containing material layer is formed on the surface of each of the plurality of microlenses.

16. The method according to claim 12, wherein the material layer is made of a resin.

17. The method according to claim 12, wherein the electronic device includes a solid-state image sensor including a photoelectric conversion unit.

18. A method of manufacturing an electronic device, comprising:
forming a material layer;
forming an anti-halation layer on the material layer, the anti-halation layer being made of a resin;
forming a resist layer on the anti-halation layer, the resist layer being made of a photosensitive resin;
forming a plurality of convex shape portions from the resist layer through exposure and development of the resist layer; and
etching the material layer while etching the plurality of convex shape portions and the anti-halation layer so that a plurality of microlenses corresponding to the plurality of convex shape portions is formed from the material layer,
wherein the anti-halation layer has a transmittance of not more than 60% for exposure light used in the exposure.

* * * * *